(12) United States Patent
Lee

(10) Patent No.: US 6,844,836 B1
(45) Date of Patent: Jan. 18, 2005

(54) SINGLE-BIT SIGMA-DELTA MODULATED FRACTIONAL-N FREQUENCY SYNTHESIZER

(75) Inventor: Sang-Oh Lee, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 10/638,529

(22) Filed: Aug. 12, 2003

Related U.S. Application Data

(62) Division of application No. 09/973,072, filed on Oct. 10, 2001, now abandoned.

(30) Foreign Application Priority Data

Oct. 10, 2000  (KR) .................................. P2000-0059408

(51) Int. Cl.[7] ......................... H03M 3/00; H03B 21/00; H03K 21/00; H03K 23/00
(52) U.S. Cl. .......................... 341/143; 327/105; 377/47
(58) Field of Search ................ 341/143, 76; 327/105, 327/117; 331/1 A; 332/100, 127; 377/44, 47; 375/376; 455/76

(56) References Cited

U.S. PATENT DOCUMENTS

| | | | | |
|---|---|---|---|---|
| 4,184,068 A | * | 1/1980 | Washburn | ...................... 377/44 |
| 4,864,634 A | * | 9/1989 | Nakagawa et al. | ............. 455/76 |
| 4,965,531 A | | 10/1990 | Riley | .......................... 331/1 A |
| 5,012,244 A | | 4/1991 | Wellard et al. | .............. 341/143 |
| 5,070,310 A | | 12/1991 | Hietala et al. | ............... 331/1 A |
| 5,079,521 A | | 1/1992 | Gaskell et al. | ............... 331/1 A |
| 5,091,706 A | * | 2/1992 | Lautzenhiser | ................ 332/127 |
| 5,093,632 A | | 3/1992 | Hietala et al. | ............... 331/1 A |
| 5,196,850 A | | 3/1993 | Duffy et al. | ................... 341/76 |
| 5,198,817 A | | 3/1993 | Walden et al. | ............... 341/143 |
| 5,414,424 A | * | 5/1995 | Cabler | ......................... 341/143 |
| 5,654,711 A | * | 8/1997 | Fujimori | ...................... 341/143 |
| 5,757,301 A | | 5/1998 | Kuo et al. | ................... 341/143 |
| 5,781,044 A | | 7/1998 | Riley et al. | .................. 327/105 |
| 5,878,101 A | * | 3/1999 | Aisaka | ......................... 377/47 |
| 5,903,194 A | | 5/1999 | Opsahl et al. | ................ 331/1 A |
| 5,949,361 A | | 9/1999 | Fischer et al. | ............... 341/143 |
| 6,008,703 A | * | 12/1999 | Perrott et al. | ................ 332/100 |
| 6,008,704 A | | 12/1999 | Opsahl et al. | ............... 332/127 |
| 6,061,008 A | | 5/2000 | Abbey | .......................... 341/143 |
| 6,313,773 B1 | | 11/2001 | Wilson et al. | ............... 341/143 |
| 6,369,623 B1 | * | 4/2002 | Heinen | ......................... 327/117 |
| 6,385,276 B1 | * | 5/2002 | Hunt et al. | ..................... 377/47 |
| 6,433,643 B1 | | 8/2002 | Opsahl et al. | .............. 331/1 A |
| 6,594,330 B1 | * | 7/2003 | Wilson | ......................... 375/376 |

FOREIGN PATENT DOCUMENTS

DE     196 40 072 A     4/1998

OTHER PUBLICATIONS

Sang Oh Lee et al.: "A 17 mW, 2.5GHz Fractional–N Frequency Synthesizer for CDMA–2000" Proceedings of the 27th European Solid–State Circuits Conference, ESSCIRC 2001, Villach, Austria, 'ONLINE!, Sep. 18, 2001, pp. 40–43, XPOO2277189.

(List continued on next page.)

*Primary Examiner*—Patrick Wamsley
(74) *Attorney, Agent, or Firm*—Valentine Francos & Whitt, PLLC

(57) ABSTRACT

A fractional-N frequency synthesizer includes a voltage-controlled oscillator, a dual-modulus divider which divides an output frequency of the voltage-controlled oscillator according to a fractional control input, and a phase comparator which compares a phase of an output of the dual-modulus divider with a phase of a reference frequency, where an output of the phase comparator controls an input of the voltage-controlled oscillator. The synthesizer further includes a sigma-delta modulator which has a single-bit output, and a bit converter which converts the single-bit output of the sigma-delta modulator to the fractional control input applied to the dual-modulus divider.

17 Claims, 9 Drawing Sheets

OTHER PUBLICATIONS

Woogeun Rhee et al.: "A 1.1 GHz CMOS Fractional–N Frequency synthesizer with a 3D 3rd–Order/SPL Delta spl Signam/Modulator" IEEE: International Solid—State Circuits Conference, XX, XX, Feb. 7, 2000, pp. 198–199, XP010378856.

Stainer P et al: Stability analysis of the second order/ spl Signam //spl Delta/modulatr Circuits And Systems, 1994. ISCAS '94., 1994 IEEE International Symposium on London, UK May 30–Jun. 2, 1994, New York, NY, USA IEEE, US, May 30, 1994, pp. 365–368, XP010143401.

Shperling I: "Sigma Delta Modulator With A Random Output Bit Stream of Specified 1/0 Average Ratio" Motorola Technical Developments, Motorola Inc. Schaumburg, Illinois, US, vol. 18, Mar. 1, 1993, pp. 156–160, XP000349609.

Terrence P. Kenny et al., "Design and Realization of a Digital ΔΣ Modulator for Fractional–N Frequency Synthesis," IEEE Transactions on Vehicular Technology, vol. 48, No. 2, Mar. 1999, pp. 510–521.

Norman M. Filiol et al., "An Agile ISM Band frequency Synthesizer with Built–In GMSK Data Modulation," IEEE Journal of Solid–State Circuits, vol. 33, No. 7, Jul. 1998.

Woongeun Rhee et al., "A L1GHz CMOS Fractional–N Frequency Synthesizer with a 3b 3rd–Order ΔΣModulator," 2000 IEEE international Solid–State Circuits Conference, pp. 198–199.

Brian Miller et al., "A multiple Modulator Fractional Divider," IEEE Transactions on Instrumentation and Measurement, vol. 40, No. 3, Jun. 1991, pp. 278–583.

* cited by examiner

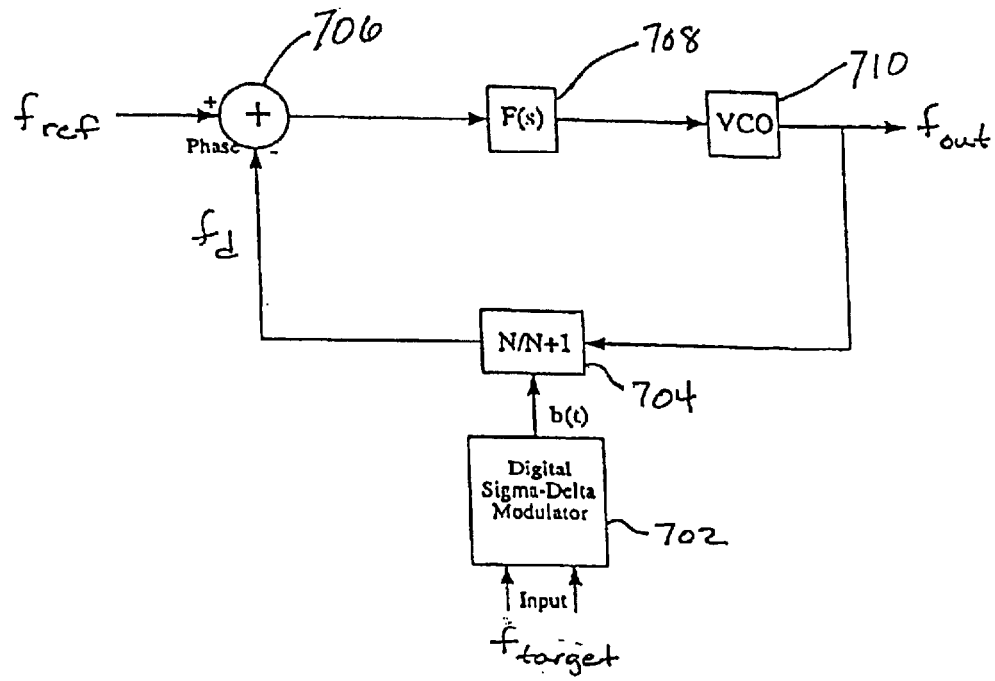
FIG. 7 *Prior Art*
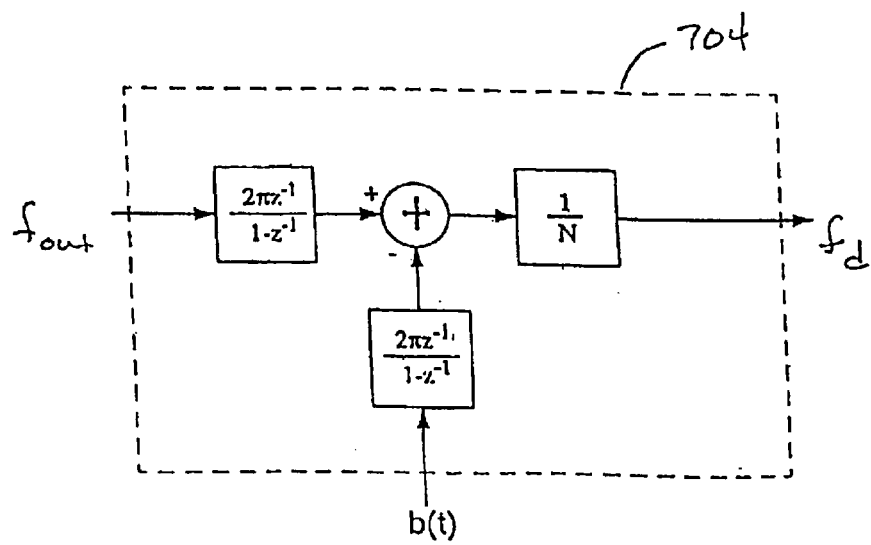
FIG. 8 *Prior Art*

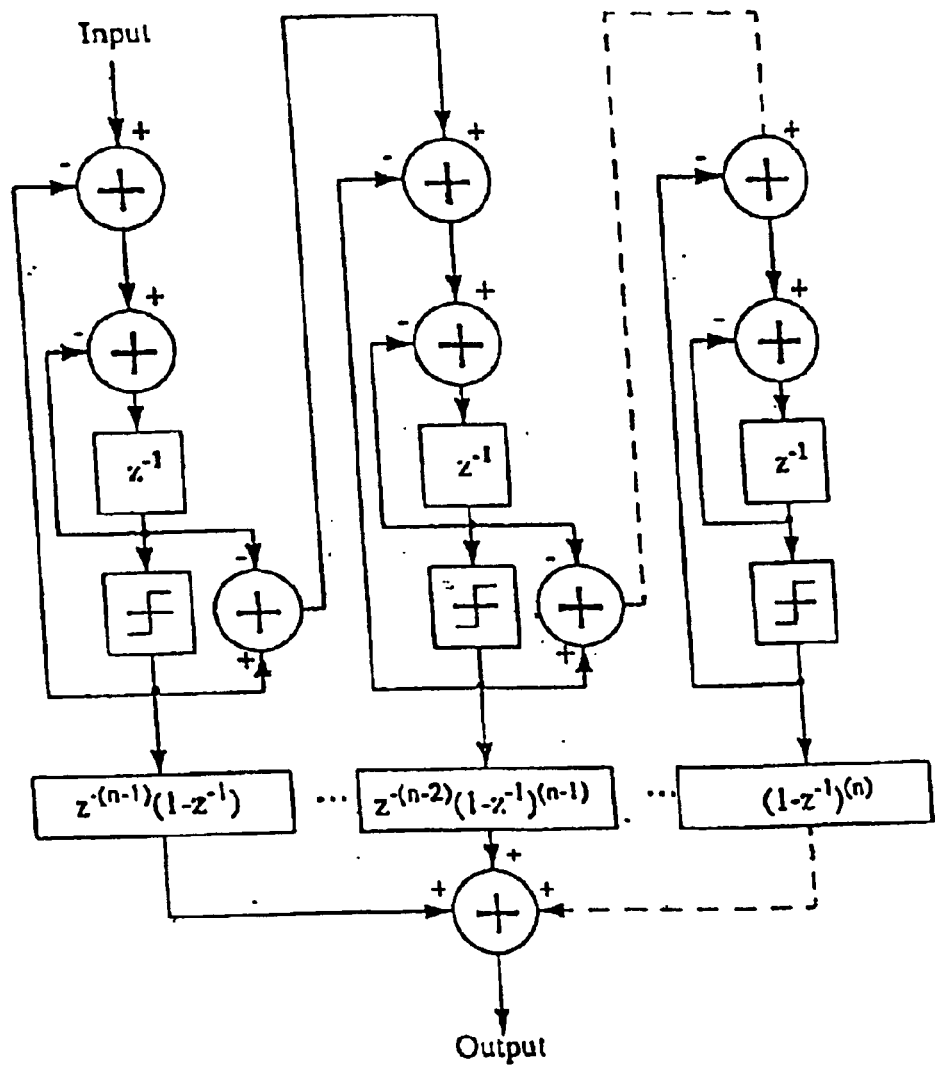
FIG. 9 *Prior Art*

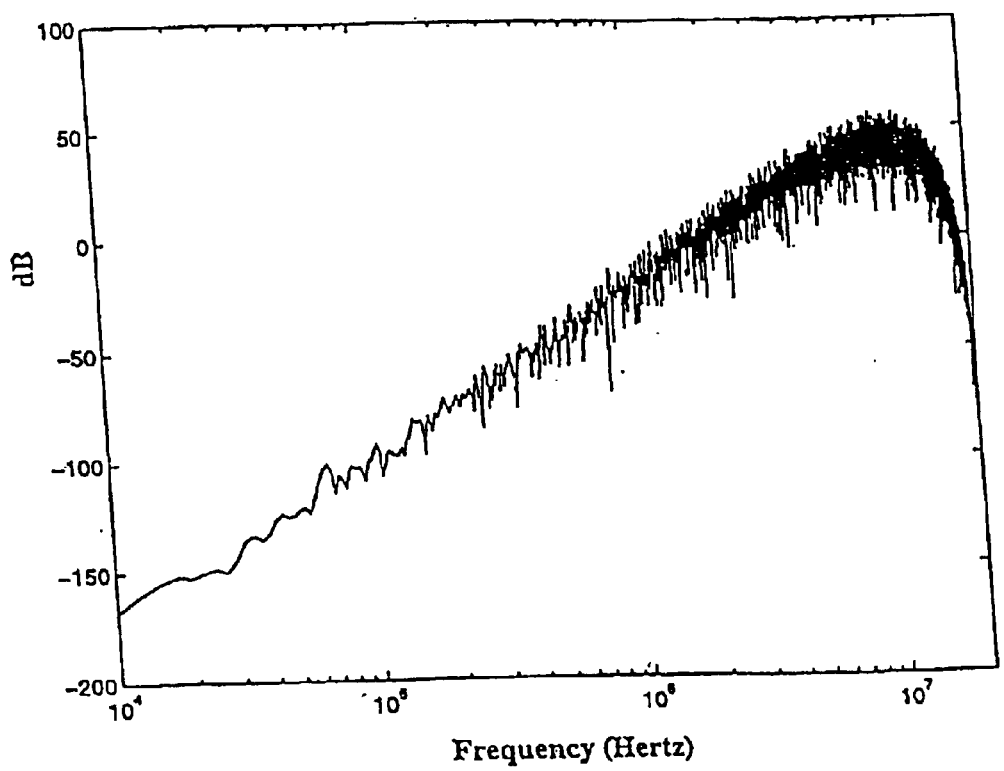
FIG. 10  *Prior Art*

SINGLE-BIT SIGMA-DELTA MODULATED FRACTIONAL-N FREQUENCY SYNTHESIZER

REFERENCE TO RELATED APPLICATIONS

This claims priority to and is a divisional of Ser. No. 09/973,072, filed 10, 2001, now abandoned the entire contents of which are incorporated herein by reference.

BACKGROUND OF THE INVENTION

1. Field of the Invention

The present invention generally relates to frequency synthesizers and to modulator circuits used in frequency synthesizers, and more particularly, the present invention relates to sigma-delta modulated fractional-N frequency synthesizers.

This is a counterpart of, and claims priority to, Korean Application No. P2000–0059408, filed Oct. 10, 2000, the entirety of which is incorporated herein by reference.

2. Background of the Invention

There is increasing demand for a variety of real-time multimedia wireless services, including real-time video, internet access, and so on. These necessitate high-speed connections with the wireless or mobile communication terminals. Reflective of this trend towards higher transmission speeds, the standard CDMA-2000 1X (2.5G) is configured such that 144-kbps data service is available at existing CDMA/PCS bands.

Wireless communications terminals commonly utilize radio-frequency (RF) frequency synthesizers to achieve programmable channel selection. To operate, for example, in the high-speed environment dictated by the CDMA-2000 1X standard, the RF frequency synthesizer should preferably exhibit a settling time of less than 500 μs, a frequency resolution of 10 KHz, and a phase noise of less than 135 dBc/Hz at about 1 MHz offset frequency. As discussed below, conventional RF frequency synthesizers are not ideally suited to meet these preferred characteristics associated with the CDMA-2000 1X standard.

FIGS. 7–10 illustrate a sigma-delta controlled fractional-N frequency synthesizer as is described in Norman M. Filiol et al., "An Agile ISM Band Frequency Synthesizer with Built-In GMSK Data Modulation," IEEE JSSC, vol. 33, pp. 998–1008, July 1998, the entirety of which is incorporated herein by reference. Sigma-delta modulation of fractional-N frequency synthesizers is also described in [1] Philip S. Gaskell et al., U.S. Pat. No. 5,079,521, issued Jan. 7, 1992; [2] Thomas A. D. Riley et al., U.S. Pat. No. 5,781,044, issued Jul. 14, 1998; [3] Thomas A. D. Riley, U.S. Pat. No. 4,965,531, [4] Brian Miller et al., "A Multiple Modulator Fractional Divider," IEEE Trans. Instrument and Measurement, vol. 40, no. 3, pp. 578–583, June 1991; [5] Terrance P. Kenny et al., "Design and Realization of a Digital Delta Sigma Modulator for Fractional-n Frequency Synthesis," IEEE Trans. Vehicular Tech., vol. 48, no. 2, pp. 510–521, March 1999; and [6] Woogeun Rhee et al., "A 1.1 GHz CMOS Fractional-N Frequency Synthesizer with a $3^{rd}$-Order Delta Sigma Modulator," ISSCC 2000, pp. 198–199, 2000. The entirety of each of these documents is incorporated herein by reference.

Referring to FIG. 7, a target frequency $f_{target}$ is fed to the input of the sigma-delta modulator 702 in the form of a digital word. A modulated output bit stream b(t) is applied to and controls the operation of the dual-modulus divider 704 contained in the feedback of a phase-locked-loop (PLL).

The PLL includes the divider 704, a phase detector 706, a loop filter 708, and a voltage-controlled-oscillator (VCO) 710.

The average value of b(t) corresponds to the division ratio required to output the desired output frequency $f_{out}$. The dual-modulus divider 704 outputs a phase control signal $f_d$, which is the N or N+1 (depending on b(t)) divided output frequency $f_{out}$. The phase control signal $f_{target}$ is applied the phase detector 706, which compares the phase control signal $f_d$ with an input reference signal $f_{ref}$.

The signal provided at the output of phase detector 706 is proportional to the phase difference between the reference signal $f_{ref}$ and the phase control signal $f_d$. This signal is filtered by the (low pass) loop filter 708, resulting in a normaly d.c. voltage, and applied to control the VCO 701 which generates the output frequency $f_{out}$.

FIG. 8 is a functional block diagram of the dual-modulus divider 704 shown in FIG. 7. The input b(t) to the divider is a single-bit control which allows 0 or 2 rad of phase (0 or 1 period of the VCO 710) to be subtracted every reference cycle from the input signal $f_{out}$. The subtraction is followed by a fixed divide by N as shown, resulting in the phase control signal $f_d$.

Sigma-delta modulators achieve high resolution from a single-bit quantizer through the use of noise-shaping and oversampling techniques. Higher order modulators have fewer limit cycle tones, and higher in-band signal-to-noise ratios. When designing higher order sigma-delta modulators, stability becomes a concern due to high-order feedback around the loop. An alternative to this approach is to use a MASH architecture.

A MASH architecture sigma-delta modulator is shown in FIG. 9. In this case, the modulator is a cascade of first-order sigma-delta modulators. The quantization error of each stage is fed forward to the next stage, whose output bitstream is a sigma-delta quantized estimate of the error from the previous stage. The outputs are then combined in a noise-shaping block which cancels the noise from the first n−1 stages, producing a multi-bit output which has nth-order noise shaping given as $$N(z)=(1-z^{-1})^n.$$

Here, n denotes the order or number of stages. FIG. 10 illustrates the frequency spectrum of a fourth-order (n=4) MASH modulator.

An advantage of this modulator architecture resides in its stability since no nth-order feedback is present and the first-order stages are stable. A primary disadvantage resides in its multi-bit output, making multi-modulus divider necessary in the feedback of the synthesizer PLL.

Moreover, the performance of the previously proposed fractional-N frequency synthesizers is generally unsatisfactory with respect to out-of-band phase noise at around 1 MHz offset or in obtaining an accurate frequency resolution of 10 kHz. Further, the synthesizer exhibit large spurs of −40 dBc under particular operating conditions, resulting in roadblocks to their actual use. It is inferred that this is because the nonlinearity of a PFD or a multi-modulus divider occurring in an actual PLL does not comport with the high linearity of the PLL which is required in using a multi-bit modulator and a MASH-type modulator. Furthermore, the previous synthesizers suffer large spurs at a particular operating condition that results from nonlinearity in the phase-frequency detector and the multi-modulus divider when multi-bit modulators and MASH-type modulators are used as a fractional division controller in PLL. For at least these reasons, conventional RF frequency synthesizers are not ideally suited to meet these preferred characteristics associated with the CDMA-2000 1X standard.

SUMMARY OF THE INVENTION

It is an objective of the present invention to provide a frequency synthesizer, and a sigma-delta modulator therefor, which allows for a fine frequency resolution and a fast settling time, and which reduces phase noise and suppresses reference spurs.

It is another objective of the present invention to provide a frequency synthesizer, and a sigma-delta modulator therefore, which allows for an accurate frequency resolution of 10 kHz, while maintaining a fast settling time, reduced phase noise, and suppressed reference spurs.

It is still another objective of the present invention to provide a frequency synthesizer, and a sigma-delta modulator therefor, which meets or exceeds the performance specifications of CDMA2000 1X.

According to one aspect of the invention, a fractional-N frequency synthesizer includes a voltage-controlled oscillator, a dual-modulus divider which divides an output frequency of the voltage-controlled oscillator according to a fractional control input, and a phase comparator which compares a phase of an output of the dual-modulus divider with a phase of a reference frequency, where an output of the phase comparator controls an input of the voltage-controlled oscillator. The synthesizer further includes a sigma-delta modulator which has a single-bit output, and a bit converter which converts the single-bit output of the sigma-delta modulator to the fractional control input applied to the dual-modulus divider.

According to another aspect of the present invention, a fractional-N frequency synthesizer includes a voltage-controlled oscillator, a dual-modulus divider which divides an output frequency of the voltage-controlled oscillator according to a fractional control input, a phase comparator which compares a phase of an output of the dual-modulus divider with a phase of a reference frequency, where an output of the phase comparator is coupled to a control input of the voltage-controlled oscillator, and a sigma-delta modulator which has a single-bit output. The sigma-delta modulator includes a cascade accumulator circuit which includes n accumulator stages, where n is an integer of at least 2, and a quantizer circuit which quantizes an output of the cascade accumulator circuit to generate the single-bit output. The output of the quantizer is fed back to each of the n accumulator stages, and a noise transfer function of the sigma-delta modulator is H(z), where $$H(z)=(1-Z^{-1})^n/(1+p_1Z^{-1}+p_2Z^{-2}\ldots+p_nZ^{-n})$$

and where $p_1 \ldots p_n$ are real number coefficients.

According to still another aspect of the present invention, a fractional-N frequency synthesizer includes a voltage-controlled oscillator, a dual-modulus divider which divides an output frequency of the voltage-controlled oscillator according to a fractional control input, a phase comparator which compares a phase of an output of the dual-modulus divider with a phase of a reference frequency, where an output of the phase comparator is coupled to a control input of the voltage-controlled oscillator, and a sigma-delta modulator which has a single-bit output. The sigma-delta modulator includes a cascaded accumulator circuit which includes n accumulator stages, where n is an integer of at least 2. Each of the n accumulator stages includes a coefficient generation circuit which selectively outputs a coefficient $b_n$, an adder having a first input which is connected to an input or to an output of a prior accumulator stage, and a second input which receives the coefficient value $b_n$ from the coefficient generation circuit, and an accumulator which receives an output of the adder. The sigma-delta modulator further includes a quantizer circuit which quantizes an output of a last one of the n accumulator stages to generate the single-bit output, where the output of the quantizer is fed back to control the coefficient generation circuit of each of the n accumulator stages.

According to yet another aspect of the present invention, a sigma-delta modulator includes a cascade accumulator circuit which includes n accumulator stages, where n is an integer of at least 2, and a quantizer circuit which quantizes an output of the cascade accumulator circuit. An output of the quantizer is fed back to each of the n accumulator stages, and a noise transfer of the sigma-delta modulator is H(z), where $$H(z)=(1-Z^{-1})^n/(1+p_1Z^{-1}+p_2Z^{-2}\ldots+p_nZ^{-n})$$

and where $p_1 \ldots p_n$ are real number coefficients.

According to another aspect of the present invention, a sigma-delta modulator includes a cascaded accumulator circuit which includes n accumulator stages, where n is an integer of at least 2. Each of the n accumulator stages includes a coefficient generation circuit which selectively output a coefficient bn, an adder having a first input which is connected to an input or to an output of a prior accumulator stage, and a second input which receives the coefficient value bn from the coefficient generation circuit, and an accumulator which receives an output of the adder. The sigma-delta modulator also includes a quantizer circuit which quantizes an output of a last one of the n accumulator stages, where the output of the quantizer is a single-bit output, and where the output of the quantizer is fed back to control the coefficient generation circuit of each of the n accumulator stages.

BRIEF DESCRIPTION OF THE DRAWINGS

The above and other objectives and advantages of the present invention will become readily apparent from the detailed description that follows, with reference to the accompanying drawings, in which:

FIG. 7 illustrates a conventional frequency synthesizer having a dual-modulus divider controlled by a sigma-delta modulator;

FIG. 8 shows a functional block diagram of the dual-modulus divider of FIG. 7;

FIG. 9 illustrates a conventional MASH sigma-delta modulator; and

FIG. 10 illustrates the frequency spectrum of a fourth-order (n=4) MASH modulator.

DETAILED DESCRIPTION OF THE PREFERRED EMBODIMENTS

Figure 1:
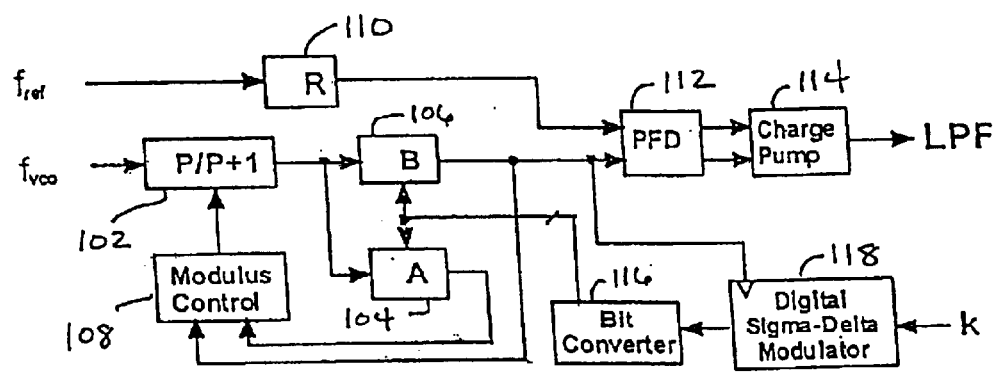
FIG. 1 illustrates the architecture of a fractional-N frequency synthesizer according to an embodiment of the present invention.

An illustrative architectural diagram of a fractional-N frequency synthesizer of an embodiment of the present invention is shown in FIG. 1. The synthesizer includes a dual-modulus prescaler 102, a programmable main counter 106, a programmable swallow counter 104, a modulus control circuit 108, a reference divider 110, a phase/frequency detector (PFD) 112, a charge pump 114, a bit converter 116, and a digital sigma-delta modulator 118. Here, instead of a multi-modulus divider, the dual-modulus divider (prescaler 102) is employed to minimize the influence of non-linearity occurring in the PLL and to facilitate implementation at low power.

The synthesizer is effectively configured as a combination of a dual-modulus pulse-swallowed frequency synthesizer, which is widely used in integer-NPLL, and the digital sigma-delta modulator 118 and bit converter 116. Generally, in operation, the division ratio is p+1 at $A(1/f_{ref})$ the reference period, and the division ratio is p at $(B-A)(1/f_{ref})$ the reference period. As such, the relationship generally between $f_{vco}$ and $f_{ref}$ is as follows:

$$f_{vco} = (Bp+A)f_{ref}$$

where B, p and A indicate the value of the main counter 106, the modulus of the prescaler 102, and the value of the swallow counter 104, respectively.

Figure 2:
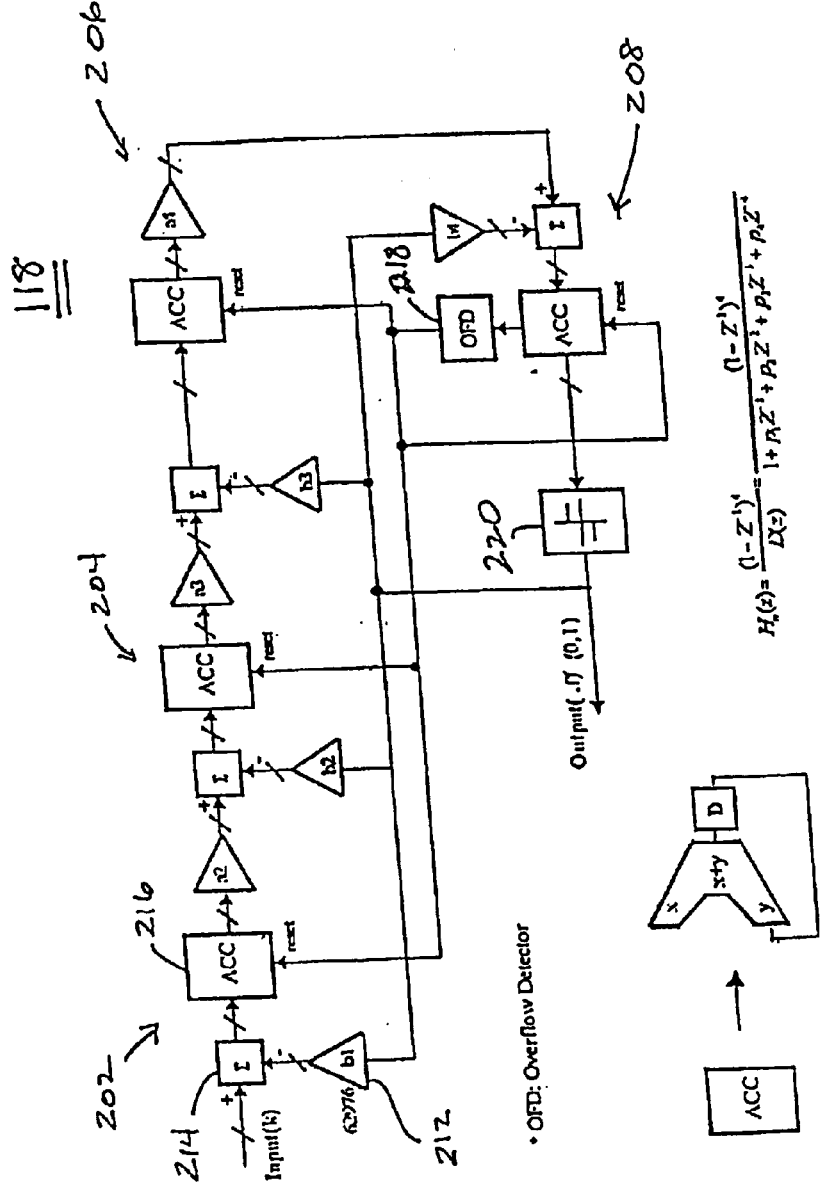
FIG. 2 is a functional block diagram of a single-bit, $4^{th}$-order sigma-delta modulator according to an embodiment of the present invention.

Referring now to FIG. 2, the digital sigma-delta modulator 118 functions as a fractional division controller and is manifested in this embodiment as a single-bit 4th-order (n=4) sigma-delta modulator having MSB (most significant bit) feedback. It is noted that the order n (i.e., the number of stages) can be decreased or increased depending on usage.

More particularly, the digital sigma-delta modulator 118 is comprised of a quantizer circuit 220 and a cascaded accumulator circuit which includes an overflow detector (OFD) 218 and four (4) accumulator stages 202, 204, 206 and 208. Each of the accumulator stages is made up of a coefficient generation circuit 212 which selectively outputs a coefficient $b_n$, an adder 214 having a first input which is connected to an input or to an output of a prior accumulator stage, and a second input which receives the coefficient value $b_n$ from the coefficient generation circuit, and an accumulator 216 which receives an output of the adder 214. Additional $a_n$ coefficient circuits may also be provided as shown.

The overflow detector 218 operates when the magnitude of the modulator input, k/b1, greatly exceeds 0.5, in which case all accumulators are reset to 0.

The quantizer 220 quantizes the output of the final stage 208, whereby the a noise transfer function of the sigma-delta modulator 118 becomes H(z), where $$H(z) = (1-Z^{-1})^n/(1+p_1 Z^{-1} + p_2 Z^{-2} \ldots + p_n Z^{-n})$$

and where $p_1 \ldots p_n$ are real number coefficients.

Referring again to FIG. 1, the modulator 118 according to the present embodiment is connected to the dual-modulus divider circuitry through a simple bit converter 116. The bit converter converts the outputs 0 and 1 of the modulator 18 into 1 and −1, respectively, and provides the results to programmed input terminals of the counters 104 and 106. The dual-modulus divider sums the results provided by the bit converter and divides the prescaler output by the summed value while performing a pulse-swallow function.

When a fractional-N frequency synthesizer according to the present invention forms a loop and is in a locked state, the VCO outputs a stable N.f times the comparison frequency, where N=Bp+A and f=k/b1, and where B, p and A denote the value of the main counter 106, the modulus of the prescaler 102, and the value of the swallow counter 104, respectively. B and A are integers and can be externally programmed. "k/b1" is a functional term, and the denominator b1 is fixed in the hardware. Frequency resolution can be easily adjusted by adjusting the denominator b1, and the fractional value of the comparison frequency $f_r$ can be adjusted by adjusting "k" which can be externally programmed.

The output of the single-bit modulator controlling the dual-modulus divider is helpful to avoid the nonlinearity problem described previously. Generally, a sigma-delta modulator effectively thrusts quantization noise occurring during digitization to high frequency. As a result, low frequency noise is substantially decreased, and by the same amount, a high frequency noise is increased, as compared with the case of no noise shaping. High frequency noise can be simply removed by performing low-pass filtering thereafter. Consequently, a signal-to-noise ratio (S/N) is increased. Since divider noise has a low-pass characteristic in the PLL, the shaped high frequency noise occurring in the sigma-delta modulator is spontaneously removed from the PLL. As a result, a fractional value having a high S/N can be obtained when a long-term average is taken. The fractional value, that is, an effective division ratio, .f, is described previously and given as $$.f = k/b1 \text{ for } -b1/2 \leq k \leq b1/2$$

For example, when b1=62976, .f=k/62976 for −31488≤k≤31488. Here, k/b1 is restricted to −0.5–0.5 for a stable operation. As described above, the feedback constant b1 is given as an invariable number, and this can be implemented by a simple multiplexer. On the contrary, a MASH modulator requires complex hardware when the denominator b1 is not the multiple of 2. Accordingly, the present invention is advantageous in that less hardware is required when the denominator b1 is not the multiple of 2, as compared with conventional techniques.

To demonstrate the advantages of the present invention in view of phase noise at a high offset frequency, the noise transfer function (NTF) of the modulator will be described. The NTF of an n-th order MASH modulator widely used in conventional fractional-N frequency synthesizers has a high pass characteristic and is expressed as $(1-z^{-1})^n$. Meanwhile, the NTF of a modulator according to the present invention is $(1-z^{-1})^n/D(z)$, where D(z) is the n-th order polynomial of $z^{-1}$. A Butterworth polynomial having a corner frequency is usually employed for stable design. For comparison, when n=4, the NTF of a conventional MASH modulator is $(1-z^{-1})^4$, and the NTF of a modulator according to the present invention is $$(1-z^{-1})^4/D(z).$$

When a frequency approaches ½ of the clock frequency of a modulator ($z^{-1}=-1$), according to the present invention, loop gain approaches 0 since the frequency has passed beyond a corner frequency. So, quantization noise is directly output without being filtered, and noise transfer gain is 1. On the other hand, in a conventional MASH method, it can be easily seen from the NTF equation that noise transfer gain is 16. When it is assumed that the same quantization noise is exerted on a 4th-order modulator according to the present invention and a MASH-type 4th-order modulator, the modulator of the present invention has a noise power which is 16 times lower than the MASH-type modulator at a high offset frequency, so that phase noise is reduced to one sixteenth compared to the conventional MASH-type modulator when the modulator of the present invention is applied to a PLL.

Figure 4:
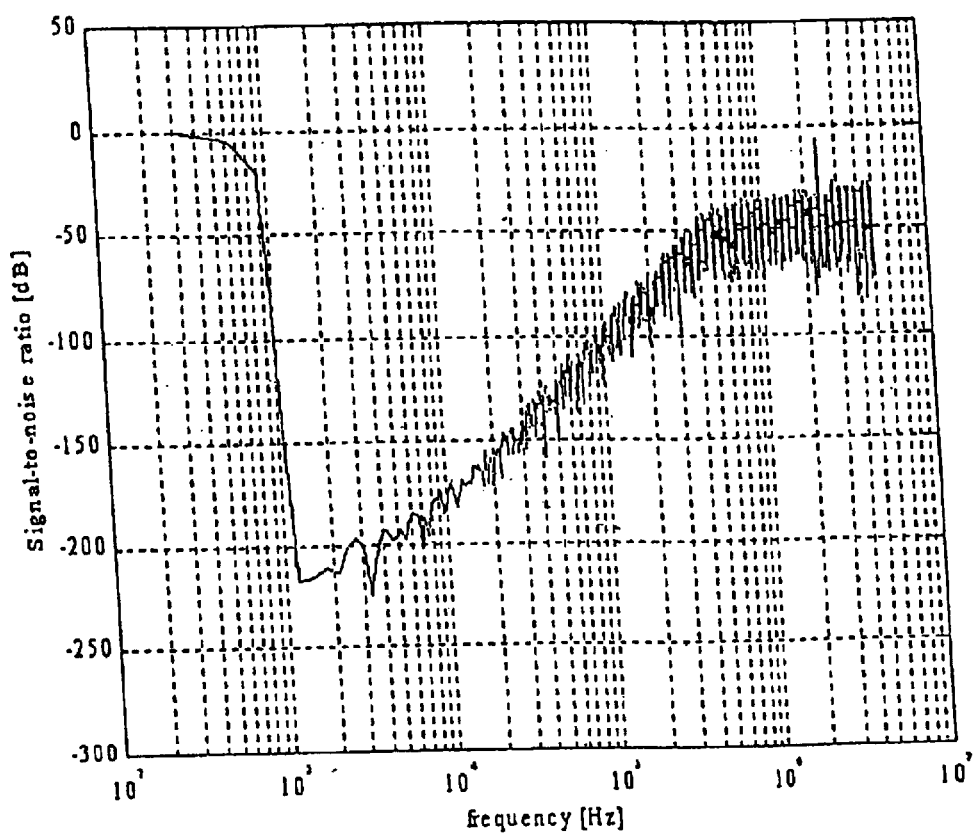
FIG. 4 is a graph of a measure signal-to-noise ratio of the sigma-delta modulator.

FIG. 4 illustrates the S/N measured from the output of a modulator according to the present invention. Here, a corner frequency is set to 0.04 times a comparison frequency. It can be confirmed that noise power is not remarkably increased and is constant after passing a corner frequency. Contrasting FIG. 10, where a frequency continuously increases without a corner frequency in the MASH-type modulator, it is clear that the modulator according to the present invention advantageously reduces phase noise at a high offset frequency.

Moreover, the modulator according to the present invention accurately realizes 10 KHz frequency resolution, thereby decreasing frequency errors in terminals. This is because minimum frequency resolution is set to a comparison frequency divided by b1. For example, when a comparison frequency is 9.84 MHz, minimum frequency resolution is 10 KHz/64. Also, the hardware of the modulator of the present invention is relatively simple. An inter-stage scaling coefficient $a_i$ can be set to the reciprocal of a multiple of 2 in order to avoid use of a multiplier and implement the modulator through only simple bit-shift operations. Since the modulator has a structure making possible lower bit truncation permitted through dynamic range simulation, the hardware may be simplified. In addition, a feedback coefficient b1 is a constant so that the modulator can be implemented using a simple multiplexer, thereby decreasing load on the hardware. As described above, the modulator according to the present invention does not have a significant adverse effect on S/N, makes bit truncation possible, does not need a multiplier, and can be implemented by an adder, register and a simple multiplexer, thereby simplifying hardware. Since a high order modulator is used, the present invention exhibits excellent idling tone performance. Therefore, a modulator according to the present invention does not need the LSB dithering that is required for a conventional MASH-type modulator.

Figure 5:
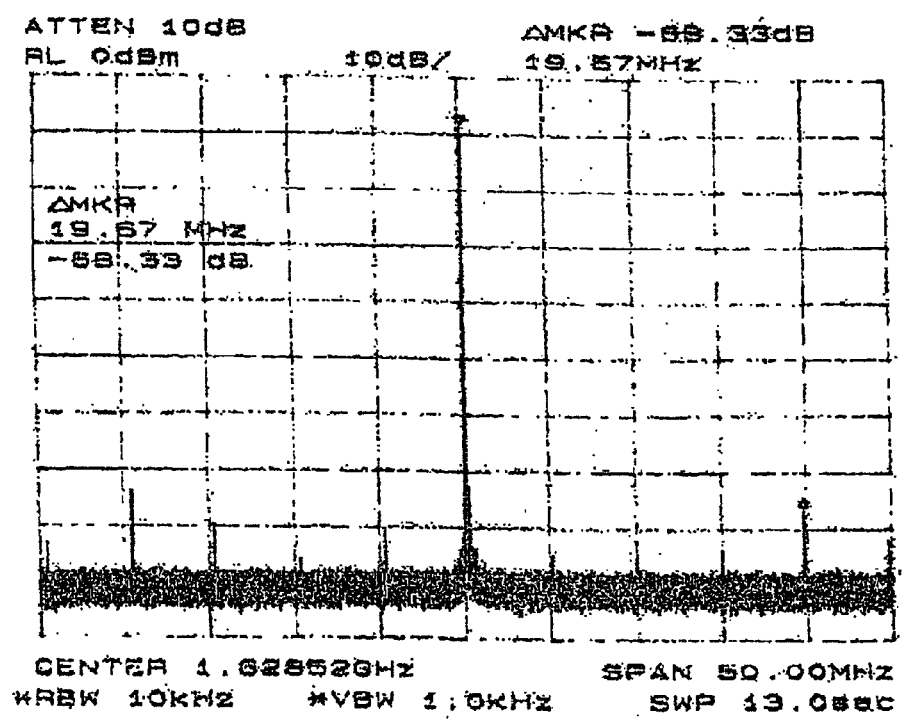
FIG. 5 is a graph of a measured voltage-controlled-oscillator output spectrum.

FIG. 5 shows the measured VCO output spectrum at 1628.52 MHz (N.f=165.5; b1=62976). The experiment was carried out in a 12 kHz-bandwidth PLL loop in which an external 33 MHz/V VCO, a $3^{rd}$-order passive LPF, and the PFD comparison frequency were used. The external LPF had one zero and three poles including two out-of-band poles. The reference and fractional spurs are less than −68 dBc.

Figure 6:
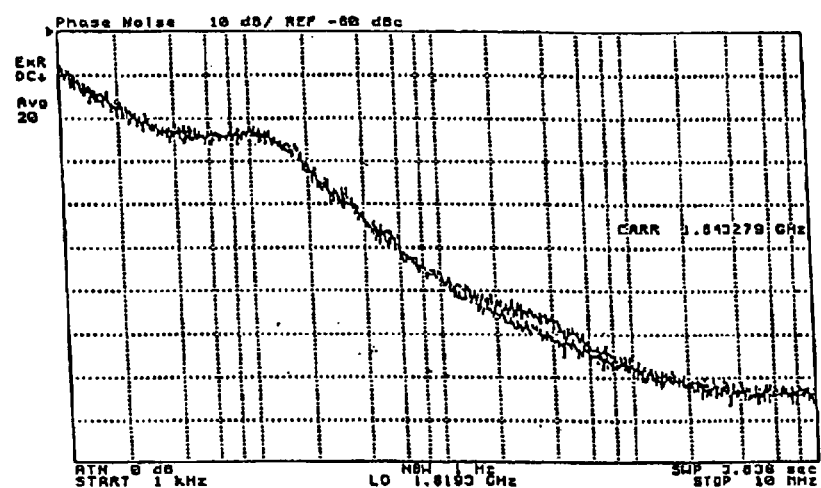
FIG. 6 is a graph of a measured single-sideband phase noise.

The measured single-sideband (SSB) phase noise at 1643.28 MHz (N.f=167.0) is shown in FIG. 6, including its integer-N result for comparison. For fair comparison, the same division ratio was used with the difference being whether the modulator is active or not. The in-band VCO phase noises are the same for both integer and fractional operations, and relatively flat with −84 dBc/Hz. This means that the sigma-delta modulator does not affect the in-band phase noise characteristic of the synthesizer. Phase noise at 1.2 MHz offset is −139 dBc/Hz. The phase noise floor from 200 MHz to 800 MHz is due to residual sigma-delta quantization noise. The rise at a lower frequency around 1 kHz may be from noises of the VCO.

In short, a fractional-N frequency synthesizer according to the present invention has the following advantages. First, the present invention exhibits a dulling effect with respect to the nonlinearity of the PLL in the given range of normal operation, so it is not characterized by large spurs. Second, the present invention can decrease phase noise by 10 dB or more at a high frequency (out-of-band). Accordingly, the present invention easily satisfies the out-of-band phase noise condition regulated for CDMA2000. Third, frequency resolution may be easily changed by adjusting the feedback coefficient b1 of the modulator, which in turn is achieved by simply changing hardware. When fr/b1 is set to a rational multiple of 10 kHz, a resolution of 10 kHz can be easily obtained. Fourth, bit optimization can be achieved in the hardware, thereby decreasing the overall hardware size. Fifth, since the present invention exhibits satisfactory idling-tone performance when using a high order modulator, a separate LSB dithering circuit is not necessary, thereby simplifying the hardware. Sixth, by using a sigma-delta modulator as a fractional division controller, fractional spurs can be decreased when a PLL loop is formed, and a reference spur is advantageously suppressed.

Figure 3:
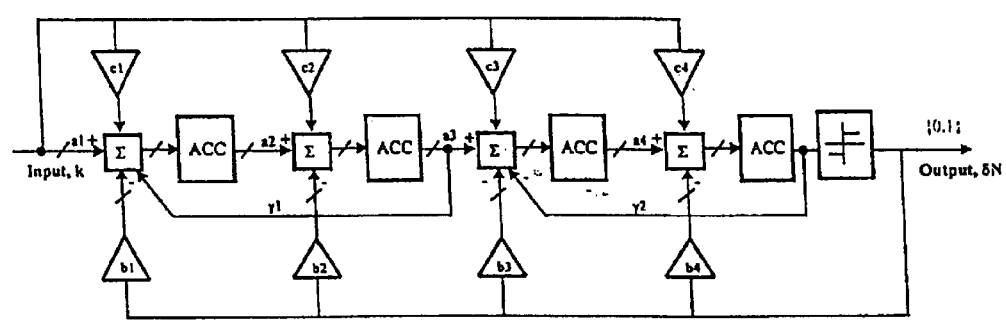
FIG. 3 is a functional block diagram of a single-bit, $4^{th}$-order sigma-delta modulator according to another embodiment of the present invention.

In the drawings and specification, typical preferred embodiments of the invention are disclosed and, although specific terms are employed, they are used in a generic and descriptive sense only and not for purposes of limitation. It will be understood by those skilled in the art that various changes in form and details may be made to the described embodiments without departing from the spirit and scope of the invention as defined by the appended claims. As one example only, it will be appreciated that the sigma-delta modulator of FIG. 2 may be configured in different ways to obtain the same or similar results, such as the configuration of the single-bit, $4^{th}$-order sigma-delta modulator shown in FIG. 3.

What is claimed is:

1. A fractional-N frequency synthesizer, comprising:
   a voltage-controlled oscillator;
   a dual-modulus divider which divides an output frequency of said voltage-controlled oscillator according to a fractional control input;
   a phase comparator which compares a phase of an output of said dual-modulus divider with a phase of a reference frequency, wherein an output of said phase comparator controls an input of said voltage-controlled oscillator;
   a sigma-delta modulator which has a single-bit output;
   a bit converter which converts the single-bit output of the sigma-delta modulator to the fractional control input applied to the dual-modulus divider.

2. The fractional-N frequency synthesizer circuit as claimed in claim 1, wherein said sigma-delta modulator comprises:
   a cascaded accumulator circuit which includes n accumulator stages, where n is an integer of at least 2, and wherein each of said n accumulator stages comprises (a) a coefficient generation circuit which selectively outputs a coefficient $b_n$, (b) an adder having a first input which is connected to an input or to an output of a prior accumulator stage, and a second input which receives the coefficient value $b_n$ from the coefficient generation circuit, and (c) an accumulator which receives an output of the adder,
   a quantizer circuit which quantizes an output of a last one of the n accumulator stages, wherein the output of the quantizer is a single-bit output, and wherein the output of the quantizer is fed back to control the coefficient generation circuit of each of the n accumulator stages.

3. The fractional-N frequency synthesizer as claimed in claim 2, wherein a noise transfer function of the sigma-delta modulator is H(z), where $$H(z)=(1-Z^{-1})^n/(1+p_1Z^{-1}+p_2Z^{-2}\ldots+p_nZ^{-n})$$

and where $p_1 \ldots p_n$ are real number coefficients.

4. The fractional-N frequency synthesizer as claimed in claim 3, wherein n is 4.

5. A fractional-N frequency synthesizer as claimed in claim 3, further comprising interstage coefficient weighting circuits which selectively supply weighting coefficients $a_{(n+)1} \ldots a_n$ between consecutive accumulator stages of the cascaded accumulator circuit, respectively.

6. The fractional-N frequency synthesizer as claimed in claim 1, wherein the sigma-delta modulator comprises (a) a cascaded accumulator circuit which includes n accumulator stages, where n is an integer of at least 2, and (b) a quantizer circuit which quantizes an output of the cascade accumulator circuit to generate the single-bit output of the sigma-delta modulator;

wherein an output of the quantizer is fed back to each of the n accumulator stages, and wherein a noise transfer function of the sigma-delta modulator is H(z), where $$H(z)=(1-Z^{-1})^n/(1+p_1Z^{-1}+p_2Z^{-2} \ldots +p_nZ^{-n})$$

and where $p_1 \ldots p_n$ are real number coefficients.

7. The fractional-N frequency synthesizer as claimed in claim 6, wherein n is 4.

8. The fractional-N frequency synthesizer as claimed in claim 1, wherein the dual-modulus divider comprises:

a prescaler which receives an output of the voltage controlled oscillator;

a modulus control circuit which controls an operation of the prescaler;

a main counter and a swallow counter each having inputs coupled to an output of the prescaler, and each having a programmed input terminal which receives the fractional control input from the bit converter, and each having outputs coupled to an input of the modulus control circuit.

9. A fractional-N frequency synthesizer, comprising:

a voltage-controlled oscillator;

a dual-modulus divider which divides an output frequency of said voltage-controlled oscillator according to a fractional control input;

a phase comparator which compares a phase of an output of said dual-modulus divider with a phase of a reference frequency, wherein an output of said phase comparator is coupled to a control input of said voltage-controlled oscillator;

a sigma-delta modulator which has a single-bit output and which comprises (a) a cascade accumulator circuit which includes n accumulator stages, where n is an integer of at least 2, and (b) a quantizer circuit which quantizes an output of the cascade accumulator circuit to generate the single-bit output;

wherein an output of the quantizer is fed back to each of the n accumulator stages, and wherein a noise transfer function of the sigma-delta modulator is H(z), where $$H(z)=(1-Z^{-1})^n/(1+p_1Z^{-1}+p_2Z^{-2} \ldots +p_nZ^{-n})$$

and where $p_1 \ldots p_n$ are real number coefficients.

10. The fractional-N frequency synthesizer as claimed in claim 9, wherein each of the accumulator stages includes an adder and an accumulator, and wherein the output of the quantizer is connected to an input of the adder of each accumulator stage.

11. The fractional-N frequency synthesizer as claimed in claim 10, wherein n is 4.

12. The fractional-N frequency synthesizer as claimed in claim 10, further comprising interstage coefficient weighting circuits which selectively supply weighting coefficients $a_{(n+)1} \ldots a_n$ between consecutive accumulator stages of the cascaded accumulator circuit, respectively.

13. The fractional-N frequency synthesizer as claimed in claim 9, wherein the dual-modulus divider comprises:

a prescaler which receives an output of the voltage controlled oscillator;

a modulus control circuit which controls an operation of the prescaler;

a main counter and a swallow counter each having inputs coupled to an output of the prescaler, and each having a programmed input terminal which receives the fractional control input from the bit converter, and each having outputs coupled to an input of the modulus control circuit.

14. A fractional-N frequency synthesizer, comprising:

a voltage-controlled oscillator;

a dual-modulus divider which divides an output frequency of said voltage-controlled oscillator according to a fractional control input;

a phase comparator which compares a phase of an output of said dual-modulus divider with a phase of a reference frequency, wherein an output of said phase comparator is coupled to a control input of said voltage-controlled oscillator;

a sigma-delta modulator which has a single-bit output and which comprises:

(a) a cascaded accumulator circuit which includes n accumulator stages, where n is an integer of at least 2, and wherein each of said n accumulator stages comprises (a) a coefficient generation circuit which selectively output a coefficient bn, (b) an adder having a first input which is connected to an input or to an output of a prior accumulator stage, and a second input which receives the coefficient value bn from the coefficient generation circuit, and (c) an accumulator which receives an output of the adder, and (b) a quantizer circuit which quantizes an output of a last one of the n accumulator stages to generate the single-bit output, wherein the output of the quantizer is fed back to control the coefficient generation circuit of each of the n accumulator stages.

15. A fractional-N frequency synthesizer as claimed in claim 14, wherein a noise transfer function of the sigma-delta modulator is H(z), where $$H(z)=(1-Z^{-1})^n/(1+p_1Z^{-1}+p_2Z^{-2} \ldots +p_nZ^{-n})$$

and where $p_1 \ldots p_n$ are real number coefficients.

16. The fractional-N frequency synthesizer as claimed in claim 15, wherein n is 4.

17. The fractional-N frequency synthesizer as claimed in claim 14, wherein the dual-modulus divider comprises:

a prescaler which receives an output of the voltage controlled oscillator;

a modulus control circuit which controls an operation of the prescaler;

a main counter and a swallow counter each having inputs coupled to an output of the prescaler, and each having a programmed input terminal which receives the fractional control input from the bit converter, and each having outputs coupled to an input of the modulus control circuit.

* * * * *